United States Patent [19]
Butler

[11] Patent Number: 5,811,864
[45] Date of Patent: Sep. 22, 1998

[54] PLANARIZED INTEGRATED CIRCUIT PRODUCT AND METHOD FOR MAKING IT

[75] Inventor: Douglas B. Butler, Colorado Springs, Colo.

[73] Assignee: United Memories, Inc., Colorado Springs, Colo.

[21] Appl. No.: 617,489

[22] Filed: Mar. 15, 1996

[51] Int. Cl.$^6$ ................................................. H01L 29/76
[52] U.S. Cl. ......................... 257/401; 257/413; 257/409
[58] Field of Search ................................... 257/752, 401, 257/413, 305, 333, 394, 395, 409

[56] References Cited

U.S. PATENT DOCUMENTS 5,606,202   2/1997   Bronner et al. ........................ 257/752

OTHER PUBLICATIONS

Fury, Michael, A., Emerging developments in CMP for semiconductor planarization, Apr. 1995.
Shibahara, et al., Trench Isolation with ∇ (NABLA)—Shaped Buried Oxide for 256MEGA—Bit Drams, 1992 IEEE.
Fazan, et al., A Highly Manufacturable Trench Isolation Process for Deep Submicron DRAMs, 1993 IEEE.
Kikuta, et al., Multilevel Planaraized–Trench–Aluminum (PTA) Interconnection Using Reflow Sputtering and Chemical Mechanical Polishing, 1993 IEEE.

*Primary Examiner*—Tom Thomas
*Assistant Examiner*—Roy Potter
*Attorney, Agent, or Firm*—Holland & Hart LLP

[57] ABSTRACT

A planarized integrated circuit and method for making it are disclosed. The method includes forming portions of a transistor structure that extend to an elevation on an integrated circuit substrate above intermediate regions above the substrate. The portions have an oxide layer on their top surfaces. A layer of polysilicon is formed overall, including in the intermediate regions, to a depth in the intermediate regions larger than the elevation to which the portions of the transistor structure extend. A chemical-mechanical-polishing step is performed on the polysilicon overall to a depth at least extending to the oxide layer on the transistor portions to create a first planarized surface. In subsequent processing, a layer of oxide may be formed over the planarized surface, with source/drain extension regions patterned in the layer of oxide and underlying structures to the surface of the substrate. Source and drain region impurities are implanted for an MOS transistor in the source/drain extension regions, and a second layer of spacer oxide is formed overall. Portions of the spacer oxide are removed in bottom portions of the source/drain extension regions, and a layer of polysilicon is formed overall to a depth deeper than a depth of the source/drain extension regions. A chemical-mechanical-polishing step is performed on the polysilicon overall to a depth at least extending to the second layer of spacer oxide to create a second planarized surface.

3 Claims, 9 Drawing Sheets

PLANARIZED INTEGRATED CIRCUIT PRODUCT AND METHOD FOR MAKING IT

BACKGROUND OF THE INVENTION

1. Field of the Invention

This invention relates to improvements in integrated circuit manufacturing processes and products made thereby, and more particularly to improvements in integrated circuit planarization techniques and products made using such techniques.

2. Background Information

In the construction of integrated circuit products that contain integrated circuits, various stages exist at which planarizing the integrated circuit wafer in which integrated circuit components are constructed becomes important. It is well known that in later stages of integrated circuit fabrication, for example, during the formation of interconnects, the step height from one vertical level to another is important so that discontinuities do not occur on a particular interconnect path. If the steps that occur are too high, the interconnect material may not be continuous from one level to another, especially if the level change is abrupt, or step-wise nonlinear.

In addition, as the design rules for integrated circuits becomes smaller, now shrinking below 0.4 microns, for example, the global planarity of the structure at various early stages in construction becomes an important consideration, as well. The global planarity is important, for example, due to the optical depth of focus of the "stepper" equipment used to form the integrated circuit features on the integrated circuit product.

Recently, a planarization technique called "chemical-mechanical-polishing", or CMP, has been receiving widespread attention. CMP has been used primarily for planarizing interconnect structures, an example of which being shown by Fury, "Emerging developments in CMP for semiconductor planarization," *Solid State Technology*, p. 47, April, 1995, incorporated herein by reference. The Fury article discloses techniques for planarizing integrated circuit substrates using (CMP) techniques, enabling global planarization of both insulator and conductor layers in multi-level metallization interconnect structures and to planarize deep and shallow trench region isolation materials. Others have proposed the use of CMP for planarizing multiple levels of metal interconnects, and for planarizing oxide deposits in trench regions to avoid oxide dishing.

SUMMARY OF THE INVENTION

In light of the above, therefore, it is an object of the invention to provide an improved integrated circuit processing technique.

It is another object of the invention to provide an improved method for planarizing an integrated circuit.

It is yet another object of the invention to provide an improved method for planarizing an integrated circuit that can be used at various stages of construction of the integrated circuit.

These and other objects, features and advantages of the invention will become apparent to those skilled in the art from the following detailed description of the invention, when read in conjunction with the accompanying drawings and appended claims.

According to a broad aspect of the invention, a method for planarizing an integrated circuit is presented. According to the method, portions of a transistor structure are formed that extend to an elevation above an integrated circuit substrate which is higher than intermediate regions above the substrate. The portions have a dielectric layer on their top surfaces. The dielectric layer may be, for example, a spacer oxide. A layer of polysilicon is formed overall, including in the intermediate regions, to have a depth in the intermediate regions larger than the elevation of the transistor structure. A chemical-mechanical-polishing step is performed on the polysilicon overall to remove a thickness of the polysilicon to a depth at least extending to the dielectric layer on the transistor portions to create a planarized surface.

If an MOS transistor is to be constructed, a gate oxide may be formed in the intermediate regions prior to the step of forming a layer of polysilicon overall, and, if desired, the step of forming portions of a transistor structure may including forming field shield portions to surround the MOS transistor.

In subsequent processing steps, a layer of oxide may be formed over the planarized surface, with source/drain extension regions patterned in the layer of oxide and underlying structures to the surface of the substrate. Source and drain region impurities are implanted for an MOS transistor in the source/drain extension regions, and a second layer of spacer oxide is formed overall. The spacer oxide is anisotropically etched to be removed from bottom portions of the source/drain extension regions, and a layer of polysilicon is formed overall to a depth deeper than a depth of the source/drain extension regions. A chemical-mechanical-polishing step is performed on the polysilicon overall to a depth at least extending to the second layer of spacer oxide to create a planarized surface.

According to another broad aspect of the invention, a method is presented for planarizing an integrated circuit in which a layer of gate polysilicon has been formed between field shield regions. The method includes forming a layer of oxide over the field shield regions and the layer of gate polysilicon, then patterning source/drain extension regions in the layer of oxide and underlying structures to the surface of the substrate adjacent the field shield regions and the layer of gate polysilicon. Source and drain region impurities for an MOS transistor are implanted in the source/drain extension regions, and a layer of spacer oxide is formed overall. Portions of the spacer oxide in bottom portions of the source/drain extension regions are removed, and a layer of polysilicon is formed overall to a depth deeper than a depth of the source/drain extension regions. A chemical-mechanical-polishing step is performed on the polysilicon overall to a depth at least extending to the layer of spacer oxide to create a planarized surface.

According to another broad aspect of the invention an integrated circuit having a planarized surface is presented. The product is constructed on an integrated circuit substrate having a polysilicon field shield layer and overlying oxide layer patterned to surround one or more transistor regions in the substrate. A gate polysilicon layer overlies a gate oxide layer, and has a surface elevation substantially equal to a surface of the field oxide layer to provide a planarized surface in combination with the oxide layer.

In another broad aspect, the structure additionally may have source and drain region impurities for an MOS transistor in the substrate beneath source/drain extension regions adjacent the polysilicon field shield layer. A layer of oxide overlies the gate polysilicon and the source/drain extensions, which fill the source/drain extension regions. The source/drain extensions having a surface elevation substantially equal to a surface of the oxide layer to provide a planarized surface in combination with the oxide layer.

According to yet another broad aspect of the invention, a method for planarizing an integrated circuit is presented. The method includes forming portions surrounding a transistor structure that extend to a predetermined elevation on an integrated circuit substrate. The surrounding portions have an oxide layer on a top surface thereof. A layer of polysilicon is formed overall, including in intermediate regions between the surrounding portions, to a depth in the intermediate regions larger than the elevation to which the surrounding portions extend. A first chemical-mechanical-polishing step is performed on the polysilicon overall to a depth at least extending to the dielectric layer on the surrounding portions to create a planarized surface. A layer of oxide is then formed over the planarized surface, and source/drain extension regions are patterned in the layer of oxide and underlying structures to the surface of the substrate. A second layer of spacer oxide is then formed overall. The spacer oxide is anisotropically etched to be removed from bottom portions of the source/drain extension regions, and a layer of polysilicon is formed overall to a depth deeper than a depth of the source/drain extension regions. A second chemical-mechanical-polishing step is performed on the polysilicon overall to a depth at least as deep as the second layer of spacer oxide to create a planarized surface.

According to still another broad aspect of the invention, a method for planarizing an integrated circuit is presented. In performing the method, a layer of field shield oxide is formed on an integrated circuit substrate. A layer of field shield polysilicon is formed on the field shield oxide layer, and a layer of field oxide is formed over the field shield polysilicon layer. The field shield oxide layer, the field shield polysilicon layer, and the field oxide layer are then removed in a transistor region to expose the substrate, and a first layer of spacer oxide is formed overall. The first spacer oxide layer is removed in the horizontal portions of the transistor region and in nontransistor regions where gate polysilicon interconnects will remain, and a layer of gate oxide is formed therein. A layer of gate polysilicon is formed in the transistor region over the gate oxide layer to a depth above that of the first spacer oxide layer. A chemical-mechanical-polishing step is then performed to planarize the gate polysilicon layer to a level substantially equal to a level of the first spacer oxide.

A second planarizing technique can also be performed in accordance with the invention in subsequent processing steps. According to the additional planarizing technique a source/drain extension region is etched to expose the substrate between the gate polysilicon layer and the field shield polysilicon layer in a source/drain region of a transistor, and a source/drain impurity is implanted into the substrate in the source/drain extension region. A second layer of spacer oxide is formed overall, which is anisotropically etched to expose the substrate, so that the second spacer oxide layer is allowed to remain on sidewalls of the field shield polysilicon layer and the gate polysilicon layer. A layer of polysilicon is then formed in the source/drain extension region to a depth greater than a height of the second spacer oxide layer. A second chemical-mechanical-polishing process is performed to planarize the source/drain extension region polysilicon layer to a level substantially equal to a level of the second spacer oxide level.

According to still yet another broad aspect of the invention, an integrated circuit is presented, which includes an integrated circuit substrate on which is formed a field shield layer surrounding a transistor region in the substrate. A first layer of spacer oxide overlies the field shield layer, the first spacer oxide layer also isolating sidewall portions of at least conductive portions of the field shield layer from the transistor region. A layer of gate oxide is on the substrate in the transistor region. A layer of gate polysilicon in the transistor region overlies the gate oxide layer. The gate polysilicon layer is planarized at a level substantially level with a level of the first spacer oxide layer.

The integrated circuit may have an additional planarized layer. In the additionally planarized embodiment, an MOS transistor channel region in the substrate underlies the gate polysilicon layer, and MOS transistor source and drain regions in the substrate are on respective opposite side of the channel region. A second layer of spacer oxide overlies the first layer of spacer oxide, isolating sidewall portions of at least conductive portions of the field shield layer and the gate polysilicon layer from source/drain extension region regions above the source and drain regions. Source/drain extensions at least fill the source/drain extension regions above the source and drain regions. The source/drain extensions are planarized at a level substantially level with a level of the second spacer oxide layer.

BRIEF DESCRIPTION OF THE DRAWING

The invention is illustrated in the accompanying drawings, in which.

In the various Figures of the drawings, like reference numerals are used to denote like or similar parts.

DETAILED DESCRIPTION OF THE PREFERRED EMBODIMENTS

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

In general, according to a preferred embodiment of the invention, a silicon, or other integrated circuit wafer is oxidized and a field oxide pattern is defined and etched into the oxide. After implanting N wells and/or P wells and isolation/punchthrough stopper implants, a gate oxide is grown and doped or undoped polysilicon thicker than the field oxide is deposited. Gate polysilicon is formed overall and a CMP process is used to remove all gate polysilicon on the field oxide while leaving gate polysilicon in active (non-field oxide) regions. Gate polysilicon regions over field oxide can be achieved by partially etching (with a gate polysilicon interconnect pattern) of the field oxide prior to gate oxidation.

Figure 1:
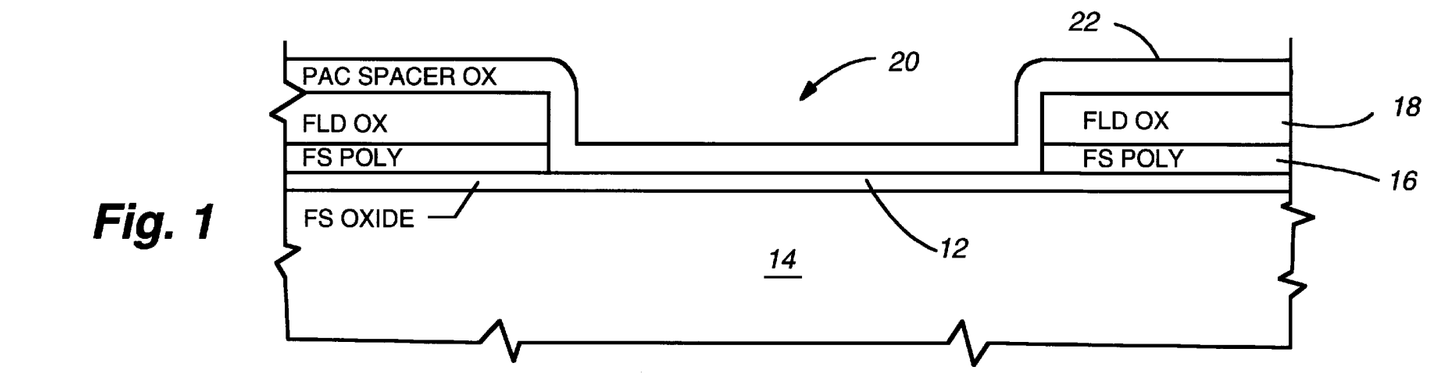
FIGS. 1–4 are cross-sectional side views of a portion of one embodiment of an integrated circuit, which includes an MOS transistor, in various intermediate stages of fabrication, showing in FIGS. 1 and 2 a first planarization of the product after formation of a gate polysilicon layer, and showing in FIGS. 3 and 4 a second planarization of the product after formation of an elevated polysilicon source/drain extension, in accordance with a preferred embodiment of the invention.
Figure 2:
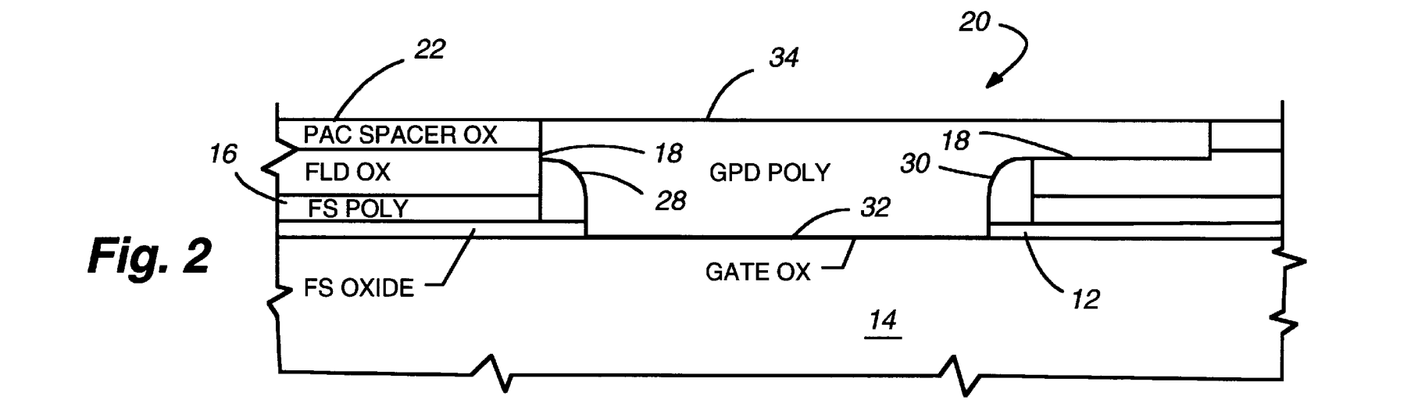
Figure 5:
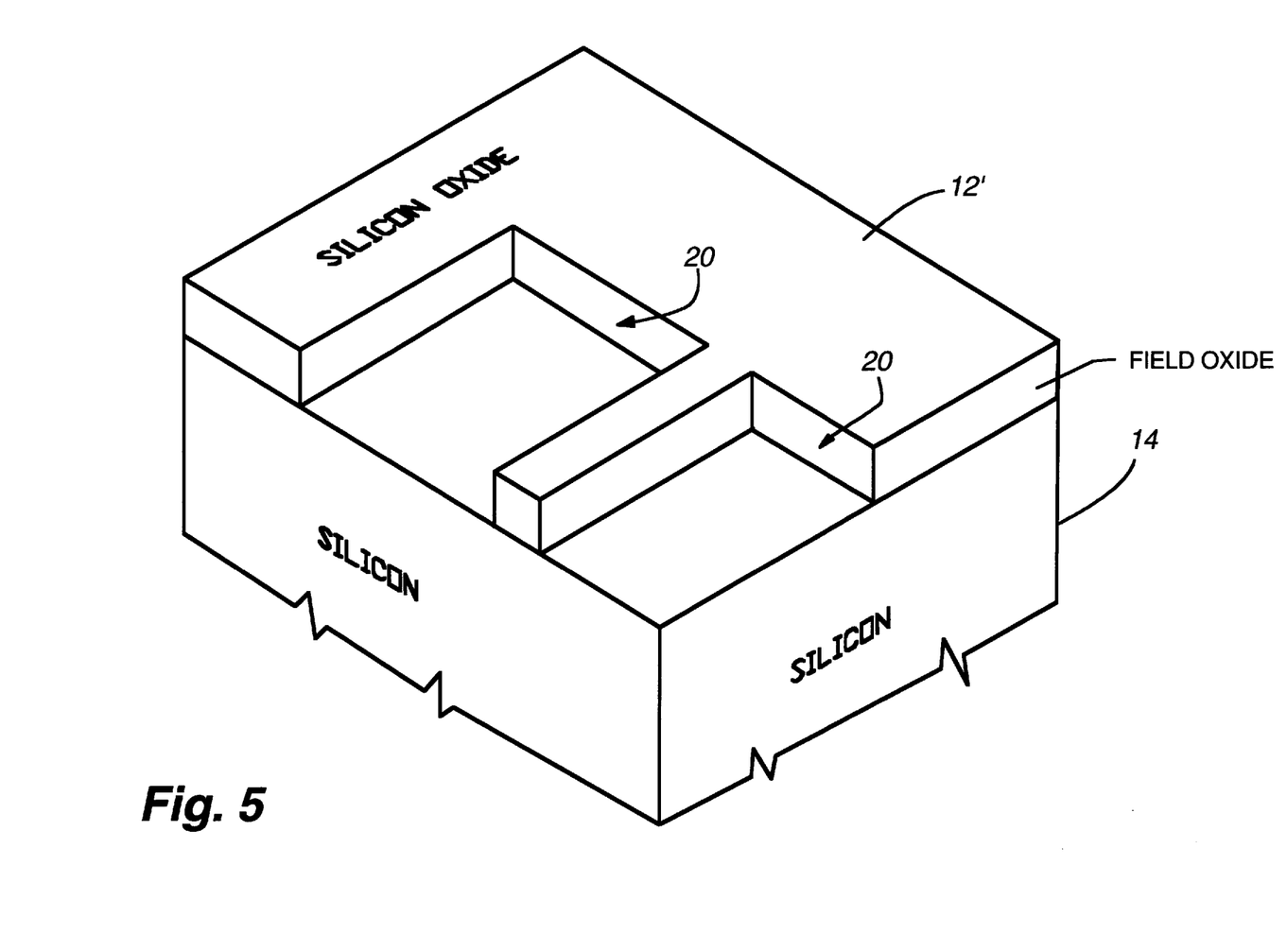
FIGS. 5–11 are perspective views of another embodiment of an integrated circuit similar to that of FIGS. 1–4, without the use of a field shield stack, showing various intermediate stages of fabrication, in accordance with another preferred embodiment of the invention.
Figure 6:
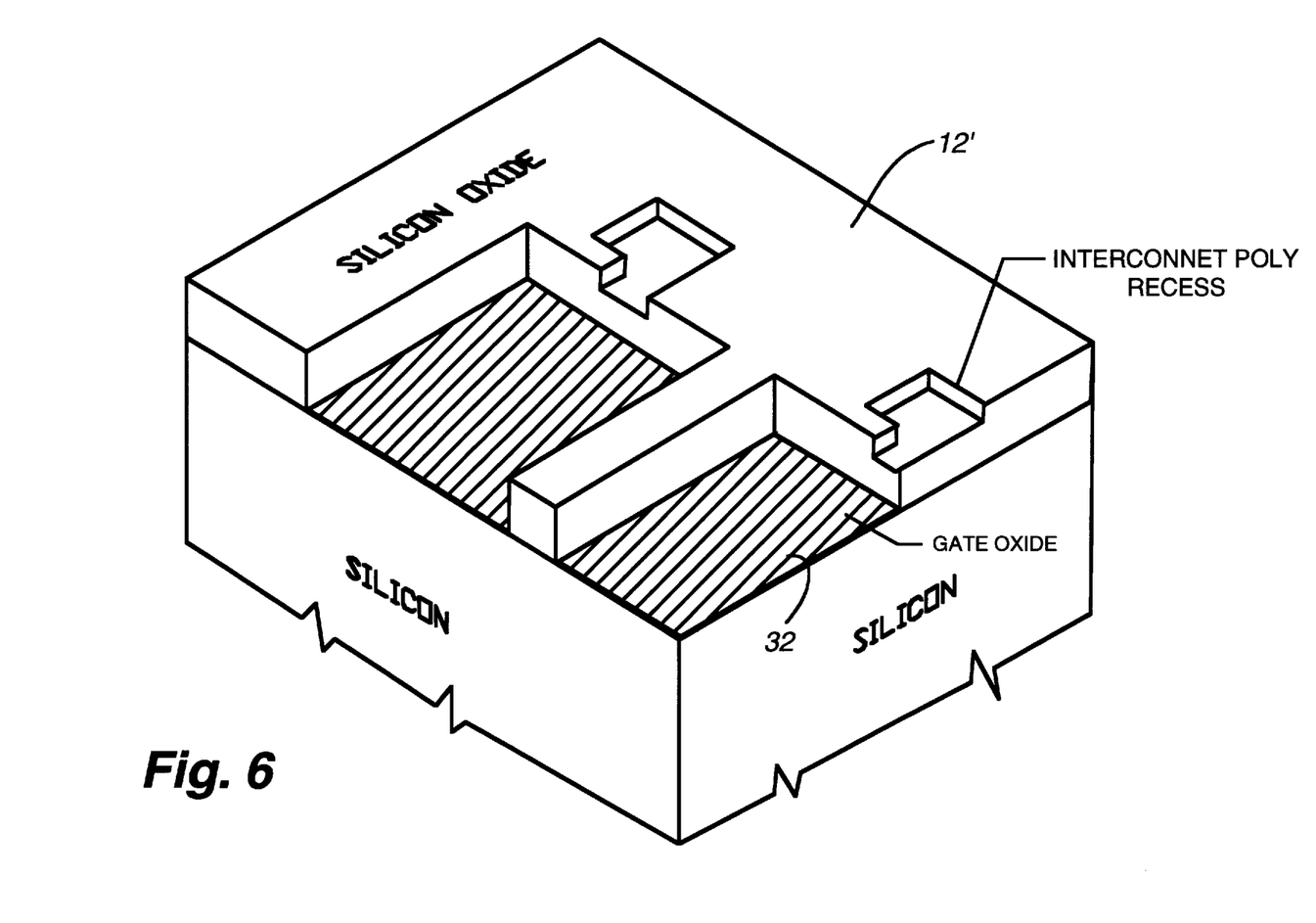
Figure 7:
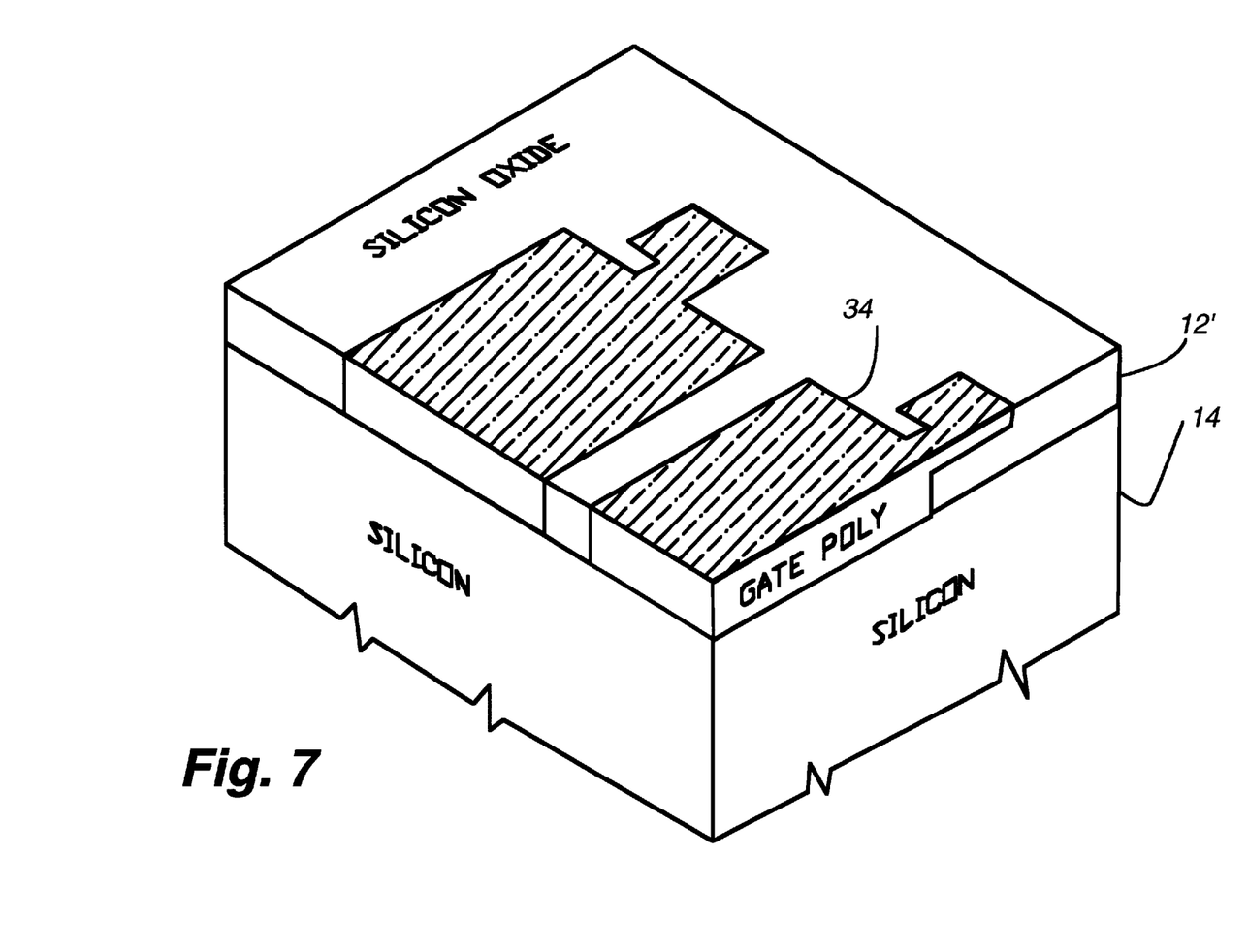

Thus, with reference now to the cross sectional drawings of FIGS. 1 and 2 and the perspective drawings of FIGS. 5–7, a first planarized structure is formed, first by forming a layer of field shield oxide 12 overall on an integrated circuit substrate 14. A layer of field shield polysilicon 16, typically doped with phosphorus, is formed on the field shield oxide layer 12. The field shield polysilicon layer 16 is then annealed, and a layer of field oxide 18 is formed thereover. The field shield oxide layer 12, the field shield polysilicon layer 16, and the field oxide layer 18 form a composite layer sometimes referred to herein merely as the field shield stack. In the embodiment shown the perspective views of FIGS. 5–7, the field shield stack layers 12, 16, and 18 are replaced by a single field oxide layer 12'.

A layer of photoresist, not shown, is then formed and patterned to define a window region for subsequent formation of multiple MOS transistors. The field oxide layer 18 and field shield polysilicon layer 16 are then etched to expose the field shield oxide 12 in the exposed window region to provide a transistor region 20 for the MOS transistor. A first layer of spacer oxide 22 is then formed overall, conformally covering the surface areas of the structure and the exposed sidewall and the exposed surface of field shield oxide 12.

As shown in FIGS. 2, the portion of the first spacer oxide layer 22 is removed in the transistor region 20, for example, by patterning a layer of photoresist, not shown, and etching the spacer oxide layer 22 and the field shield oxide in the transistor region 20, as shown. By using an anisotropic etch to remove the spacer oxide layer 22, sidewall oxide portions 28 and 30 remain, insulating the field shield polysilicon regions 16 from the transistor region 20, as shown. (In the embodiment shown in the perspective views of FIGS. 5–7, a separate spacer oxide is not necessary, since the field oxide layer 12' is entirely of field oxide.)

The photoresist layer is then stripped, and the surface of the substrate 14 cleaned in preparation for a gate oxide growth. The gate oxide 32 is then grown in the entire exposed region, as shown in FIGS. 2 and 6. Although a gate oxide layer 32 is shown being grown, it will be understood that other gate dielectric materials may be grown or deposited, the particular gate dielectric not being material to the planarization steps of the invention.

Following the growth of the gate oxide 32, a layer of gate polysilicon 34 is deposited on the wafer to a thickness greater than the thickness of the field shield stack in the embodiment of FIGS. 1 and 2 or greater than the field oxide layer 12' in the embodiment of FIGS. 5–7. The gate polysilicon 34 may be doped or undoped.

A chemical-mechanical-polishing (CMP) step is then performed to planarize the gate polysilicon layer 34 to a level substantially equal to a level of the first spacer oxide 22, as shown in FIGS. 2 and 7. The CMP step may be, for example, a CMP process similar to those described by Fury, above described. It is noted that the surface of the oxide layer 22 may be used as a stop for the CMP process, resulting in a substantially planar top surface of the integrated circuit at this particular early stage in the integrated circuit fabrication. It will be appreciated that depending upon the particular CMP process employed, some experimentation may be needed to optimize the CMP parameters to produce the planzarized intermediate integrated circuit shown. It is also noted that since the CMP process is applied overall, the planarization process is globally applied, and, as a result, the intermediate integrated circuit is substantially globally planar, enhancing the suitability of the product for subsequent photolithographic processing steps.

Figure 3:
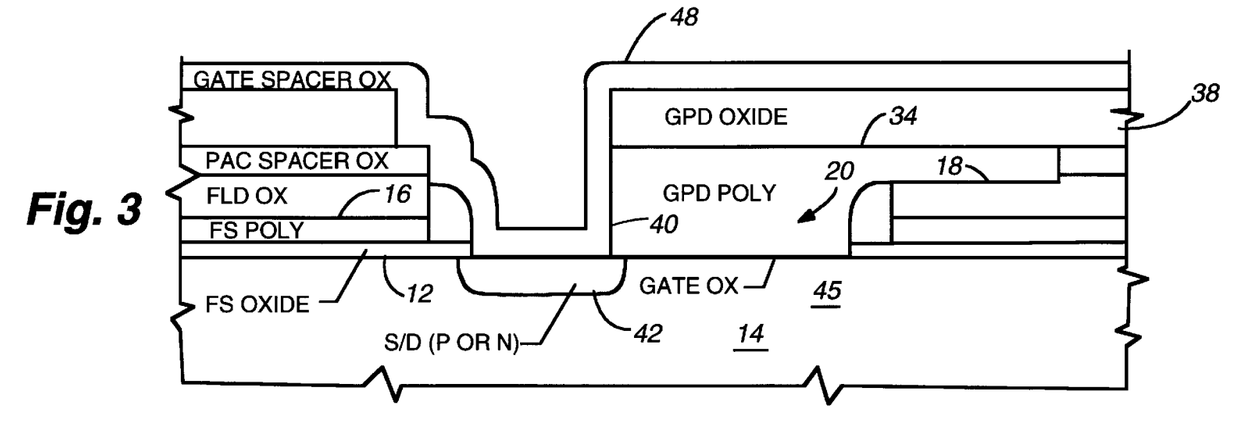
Figure 4:
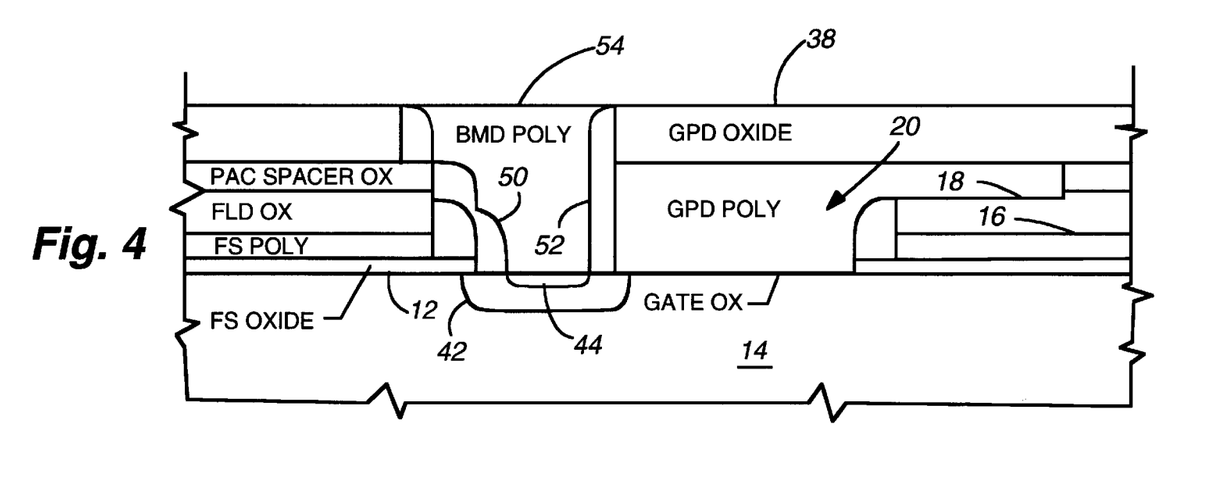
Figure 8:
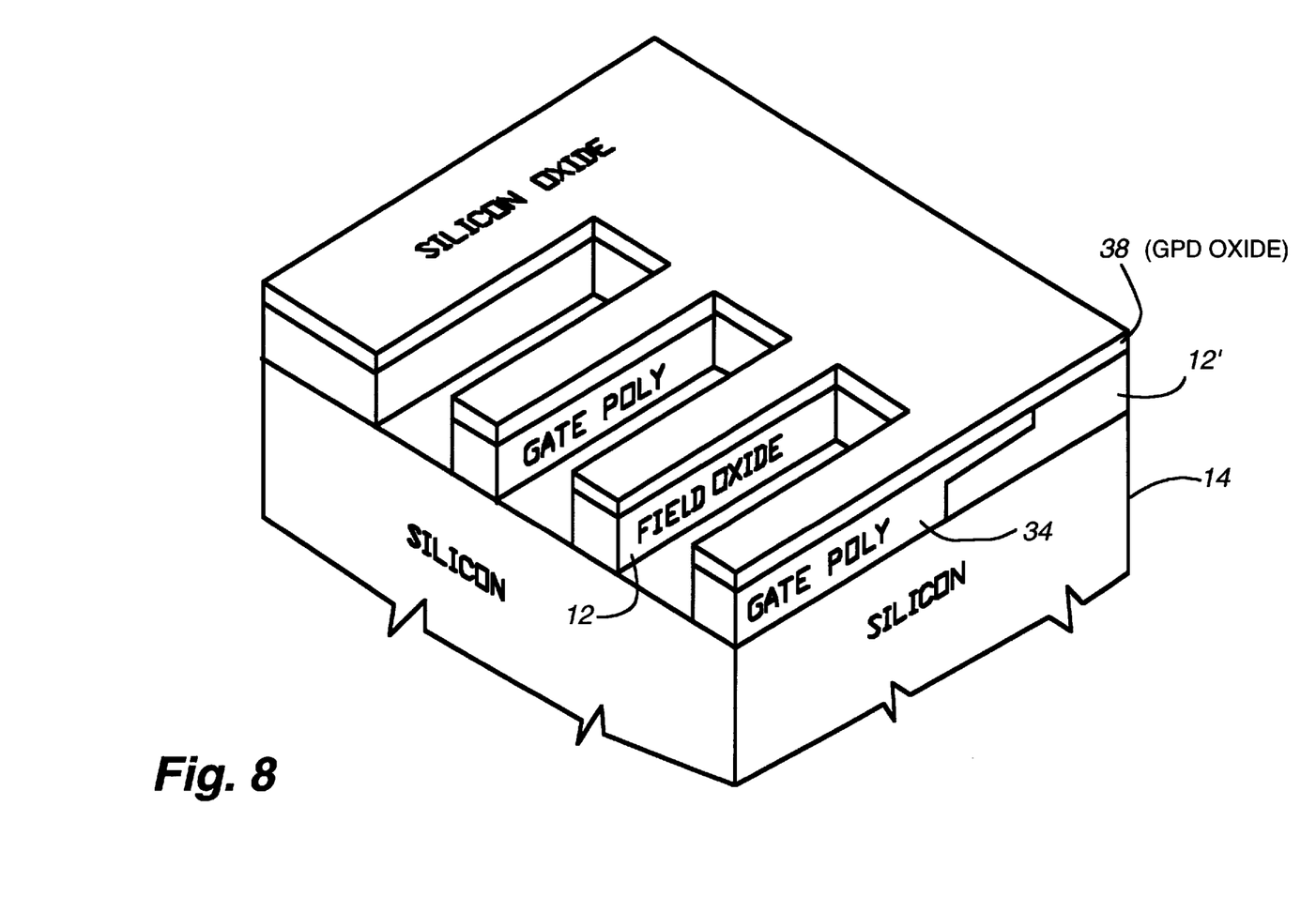

A second planarizing technique can also be performed in conjunction with the invention in subsequent processing steps, as shown in FIGS. 3 and 4 and in FIGS. 8–11. According the additional planarizing technique a second oxide layer 38 is formed over the initially planarized surface, as shown in FIGS. 3 and 8. A photoresist mask, not shown, is patterned over the oxide 38. The oxide 38 is then etched, exposing portions of the gate polysilicon 34. The exposed portions of the gate polysilicon 34 are then etched, exposing portions of the gate oxide 32. A low dose implant is then done into the substrate through the exposed portions of gate oxide 32 to form a source/drain region 42, which, as will become apparent, may provide a lightly doped drain region for the drain element, formed as below described.

Figure 9:
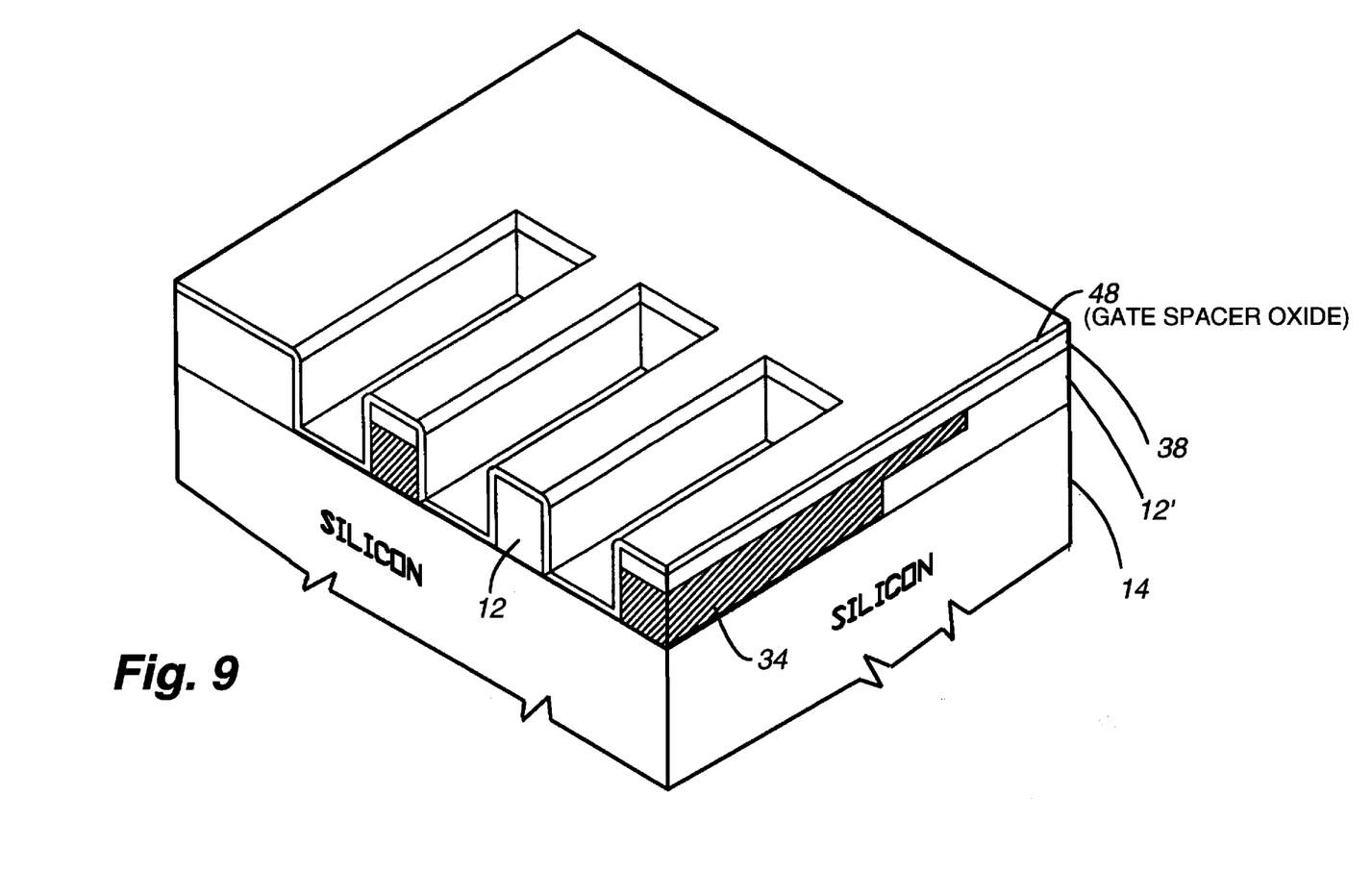
Figure 10:
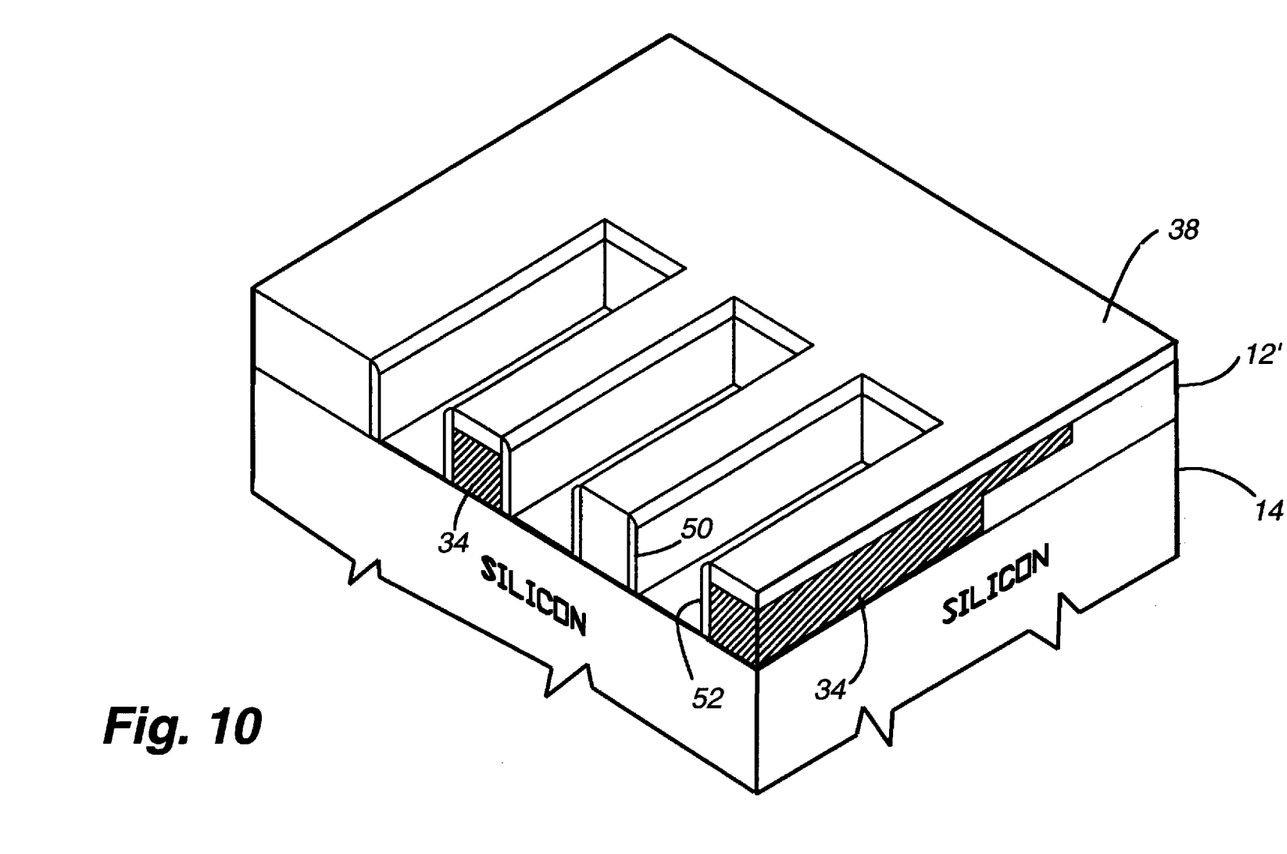

A second spacer oxide layer 48 is then formed overall, conformally covering the surface areas of the structure and the exposed sidewall and bottom surfaces of the source/drain extension region 40, as shown in FIGS. 3 and 9. The second spacer oxide layer 48 is then anisotropically etched to expose a region of the substrate 40, leaving the sidewall oxide spacers 50 and 52 remaining on the vertical surfaces, as best seen in FIGS. 4 and 10.

Figure 11:
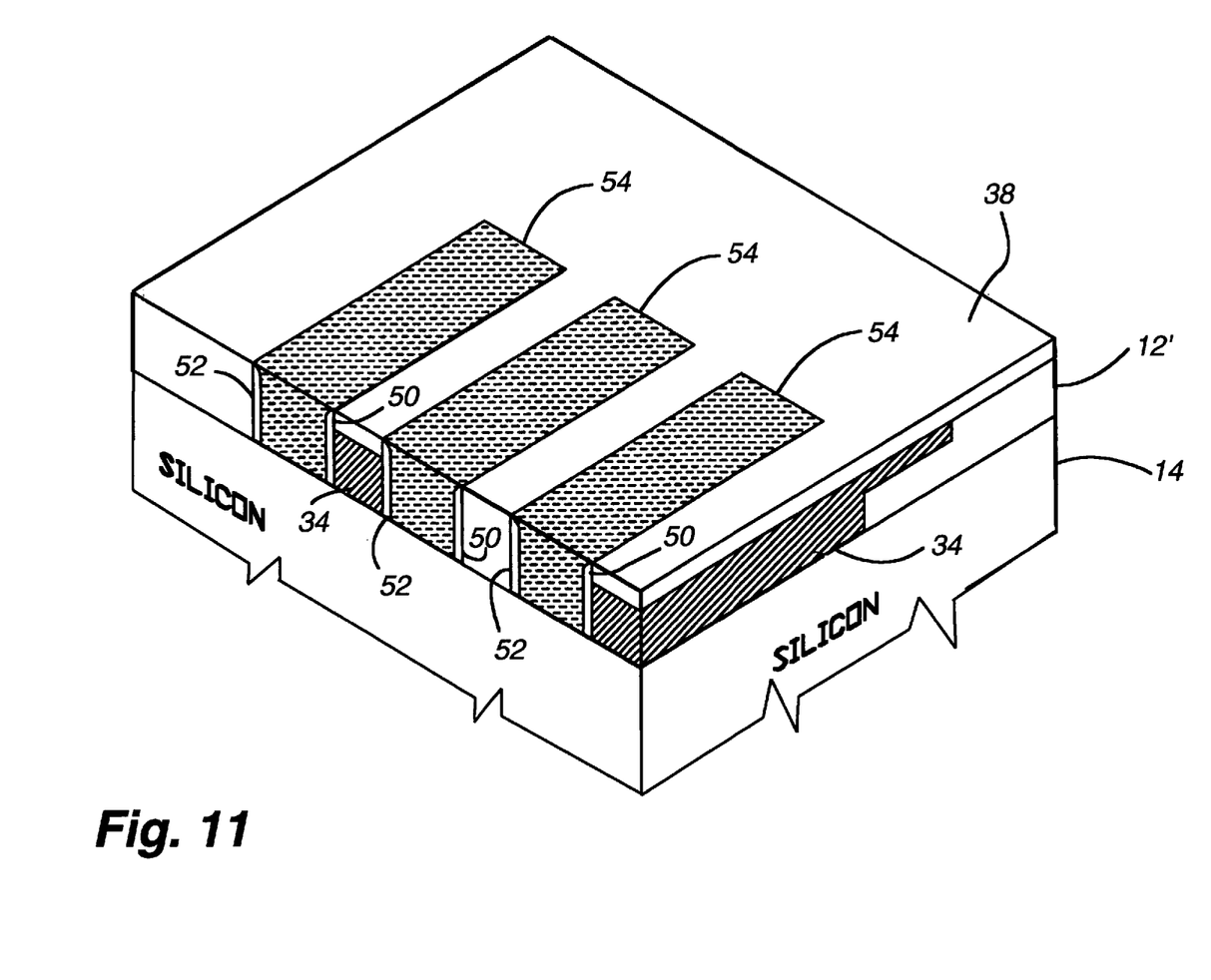

With reference now to FIGS. 4 and 11, a layer of polysilicon 54 is then formed in the source/drain extension region 40 to a depth greater than the height of the second spacer oxide layer 38. The oxide spacers 50 and 52 insulate the gate polysilicon layer 34 and field shield polysilicon layer 16 from the polysilicon layer 54. The thickness or depth of the layer of polysilicon 54 is selected to present an amount of polysilicon over and at least partially above the height of the oxide layer 38 so that when the CMP processing, next below described, is performed, the overall surface of the still incomplete integrated circuit can be substantially completely planarized by removal of the excess polysilicon of the layer 54. The remaining portion of the polysilicon layer 54, therefore, will be source/drain extensions within the source/drain extension regions 40.

As mentioned, a second chemical-mechanical-polishing process is performed to planarize the polysilicon layer 54 within the source/drain extension regions 40 to a level substantially equal to the height of the second oxide layer 38, as can be seen in FIGS. 4 and 11. As described above, the CMP step may be a process similar to those described in the Fury article. Again, some experimentation may be needed to optimize the CMP parameters to produce the planzarized intermediate integrated circuit shown. Since the second CMP process is globally applied, the resulting intermediate integrated circuit will remain substantially globally planar, enhancing the suitability of the product for subsequent processing steps.

A high dose implant is performed into the polysilicon source/drain extension 54. This implant is then diffused into the previously formed source/drain region 42 within the silicon substrate 14, forming the shallow junction region 44 to complete the source/drain region, seen in FIG. 4. The diffusivity of common source/drain dopants boron (p-channel), arsenic and phosphorus (n-channel) is about 10 times faster in polysilicon than in the silicon substrate, allowing the formation of controlled shallow junctions 44.

Thus, the second intermediately completed integrated circuit again is planarized to provide a globally planarized surface for subsequent processing, such as an interconnect metallization, or another suitable process. Since the initial surface of the product was already substantially planar due to the planarization steps above described with regard to the planarization of the gate polysilicon layer 34, it will be appreciated that after the second planarization step of the source/drain extensions, the overall surface will remain remarkably locally and globally planarized, compared to previous techniques.

It will be appreciated that by use of either the planarization method at the gate polysilicon level or the planarization method at the source/drain extension level, or both, a planarized integrated circuit can be achieved. The integrated circuit, in any event, will present a planarized surface at various intermediate stages of construction, and will enable improved results from photolithographic, interconnect and other processes that require maximum local and global planarity.

As can be seen from FIGS. 2 and 7, at the gate polysilicon planarization stage, the gate polysilicon layer 34 overlying the gate oxide 32 over the channel region of the transistor is substantially planar with the top surface of the first spacer oxide layer 22. As best seen in FIGS. 4 and 11, at the source/drain extension planarization stage, the source/drain extension region polysilicon 54 overlying and contacting the source/drain region 42 is substantially planar with the top surface of the second spacer oxide layer 38.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. An integrated circuit having a planarized surface, comprising:

an integrated circuit substrate;

a polysilicon field shield layer on a surface of said substrate and surrounding a transistor region in said substrate;

a field oxide layer on said polysilicon field shield layer;

a gate oxide layer on said substrate and within said transistor region;

a gate polysilicon layer on said gate oxide layer and within said transistor region, said gate polysilicon layer having a surface elevation substantially equal to a surface of said field oxide layer to provide a planarized surface in combination with said field oxide layer;

source and drain region impurities for an MOS transistor in said substrate in source/drain extension regions adjacent said polysilicon field shield layer;

a layer of oxide over said gate polysilicon;

and source/drain extensions filling the source/drain extension regions;

said source/drain extensions having surface elevations substantially equal to a surface of said oxide layer to provide a planarized surface in combination with said oxide layer.

2. An integrated circuit, comprising:

an integrated circuit substrate;

a field shield layer surrounding a transistor region in said substrate;

a first layer of spacer oxide over said field shield layer, said first spacer oxide layer isolating sidewall portions of at least conductive portions of said field shield layer from said transistor region;

a layer of gate oxide on said substrate in said transistor region;

a layer of gate polysilicon in said transistor region over said gate oxide layer, said gate polysilicon layer being planarized at a level substantially level with a level of said first spacer oxide layer;

an MOS transistor channel region in said substrate underlying said gate polysilicon layer, and MOS transistor source and drain regions in said substrate on respective opposite side of the channel region;

a second layer of spacer oxide over said first layer of spacer oxide isolating sidewall portions of at least conductive portions of said field shield layer and said gate polysilicon layer from source/drain extension region regions above said source and drain regions; and source/drain extensions at least filling the source/drain extension regions above said source and drain regions, said source/drain extensions being planarized at a level substantially level with a level of said second spacer oxide layer.

3. The integrated circuit of claim 2 wherein said field shield layer is a composite layer comprising:

a layer of field shield oxide on an integrated circuit substrate;

a layer of field shield polysilicon on said field shield oxide layer;

a layer of field oxide over said field shield polysilicon layer.

* * * * *

UNITED STATES PATENT AND TRADEMARK OFFICE
CERTIFICATE OF CORRECTION

PATENT NO. : 5,811,864
DATED : September 22, 1998
INVENTOR(S) : Douglas B. Butler It is certified that error appears in the above-identified patent and that said Letters Patent is hereby corrected as shown below:

[73] Assignee: United Memories, Inc., Colorado Springs, Colorado and Nippon Steel Semiconductor Corporation, Chiba, Japan Signed and Sealed this Twenty-ninth Day of May, 2001

Attest:

NICHOLAS P. GODICI

*Attesting Officer*    *Acting Director of the United States Patent and Trademark Office*